(12) United States Patent
Sakamoto

(10) Patent No.: US 6,891,250 B1
(45) Date of Patent: May 10, 2005

(54) SEMICONDUCTOR DEVICE WITH BIPOLAR TRANSISTOR

(75) Inventor: Kazuhisa Sakamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/926,425

(22) PCT Filed: Apr. 28, 2000

(86) PCT No.: PCT/JP00/02867

§ 371 (c)(1),
(2), (4) Date: Oct. 30, 2001

(87) PCT Pub. No.: WO00/67330

PCT Pub. Date: Nov. 9, 2000

(30) Foreign Application Priority Data

Apr. 30, 1999 (JP) .......................................... 11/124515
May 14, 1999 (JP) .......................................... 11/134477

(51) Int. Cl.$^7$ ..................... H01L 27/082; H01L 27/102; H01L 29/70; H01L 31/11
(52) U.S. Cl. ..................... 257/592; 257/583; 257/584; 257/578; 257/593
(58) Field of Search .................................. 257/563–566, 257/578–580, 583–585, 587, 590–593

(56) References Cited

U.S. PATENT DOCUMENTS 5,408,124 A * 4/1995 Palara ........................ 257/580
5,432,360 A * 7/1995 Kim et al. .................. 257/104

OTHER PUBLICATIONS

International Preliminary Examination Report (Form PCT/IPEA/416).

* cited by examiner

Primary Examiner—Shouxiang Hu
(74) Attorney, Agent, or Firm—Arent Fox, PLLC

(57) ABSTRACT

A base contact section of a planar structure electrically connecting a base electrode to a base region of a bipolar transistor is constructed of a repeating structure in a plan view, in which a high impurity concentration region of the same conductivity type as that of the base region and a region of the reverse conductivity type from that of the base region or low concentration region of the same conductivity type as that of the base region, arranged in an alternately manner starting with a high impurity concentration region of the same conductivity type as that of the base region from an emitter region side. With such a structure, accumulation of minor carriers in the base contact section can be suppressed, a high switching speed can be achieved and reduction in power consumption can be realized. Further, the emitter region is formed in a configuration of a plurality of stripes and the base region to which a base electrode is not connected is formed in each of the emitter regions of a stripe pattern, thereby enabling not only a junction area between the emitter regions and the base region to be increased with no space for the base electrode provided but also a safe operation area to be wider.

2 Claims, 13 Drawing Sheets

F I G. 6
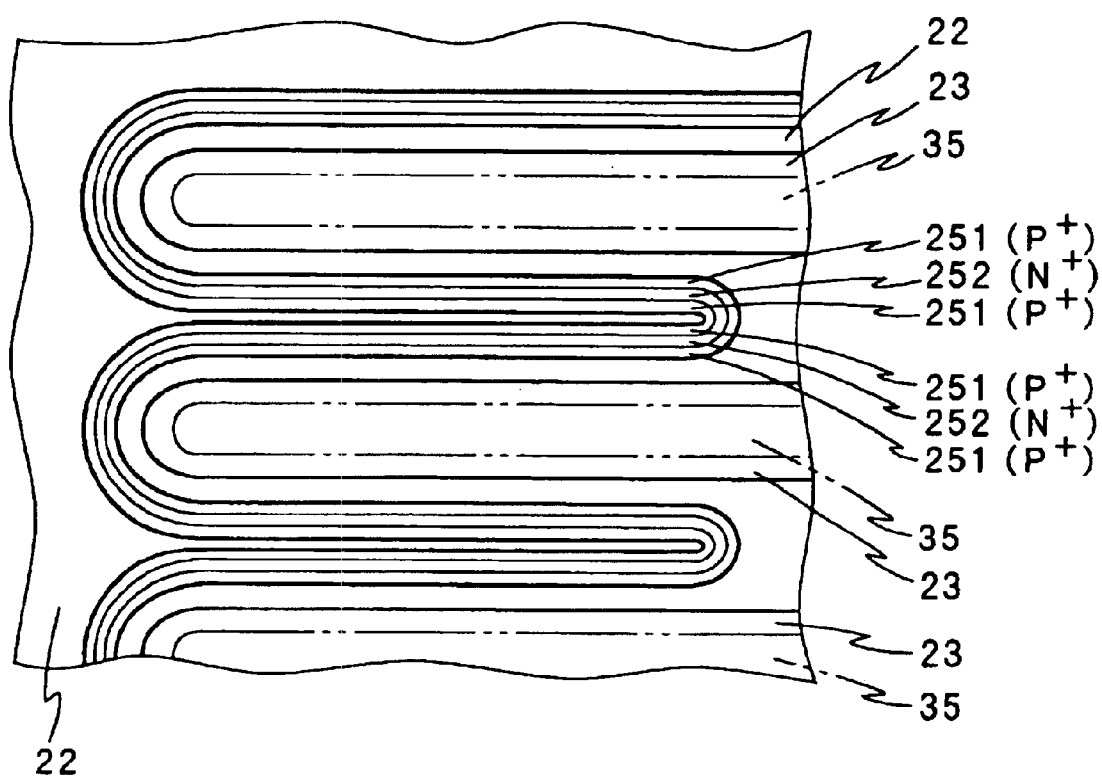

SEMICONDUCTOR DEVICE WITH BIPOLAR TRANSISTOR

FIELD OF THE INVENTION

The present invention relates to a semiconductor device with a bipolar transistor having a high switching speed and an improved withstand voltage. More particularly, the invention relates to a semiconductor device with a bipolar transistor having a multi-emitter or a multi-base structure that can operate with a large current, a high withstand voltage, a high speed switching and an increased safe operation area (SOA).

BACKGROUND ART

A fundamental structure of a conventional bipolar transistor is shown in FIG. 17. That is, in the bipolar transistor, a P-type base region 12 is formed in a surface layer of an N-type semiconductor substrate 1 and an N-type emitter region 13 is formed in the P-type base region 12. A base electrode 15 and an emitter electrode 16 are in contact with the base region 12 and the emitter region 13, respectively. A collector electrode is to be formed at the back surface side of the N-type semiconductor substrate 1 through an $N^+$-type region 14. A numerical mark 17 indicates an insulation film.

In order to increase a current amplification factor, an impurity concentration in the base region 12 is necessary to be low. If the impurity concentration is excessively lowered, however, a contact between the base region 12 and the base electrode 15 works as a Schottky junction, which makes it impossible to obtain transistor characteristics. Therefore, a $P^+$-region 18 for formation of an ohmic junction is formed at a contact region of the base region 12, with which the base electrode 15 is in contact.

Further, in a transistor which requires a large current in operation, an area and perimetric length of an emitter are increased so as to reduce a current density since a magnitude of a collector current depends mainly on the area and perimetric length of an emitter. Therefore, as shown in pattern examples of an emitter region 13 of FIGS. 17 to 20, a bipolar transistor with a multi-emitter structure or a multi-base structure has been considered.

FIG. 18 shows a structure of a bipolar transistor of a mesh emitter (multi-emitter) type. In this transistor, insular emitter regions 13 are arranged in a grid pattern, being embedded in a base region 12 formed in the surface layer of a semiconductor substrate 15. Further, an emitter electrode (not shown) is in common contact with the insular emitter regions 13.

FIG. 19 shows a structure of a bipolar transistor of a ring emitter (mesh base; multi-base) type. In this transistor, an broadly extended emitter region 13 are formed in a base region 12 formed in the surface layer of a semiconductor substrate 1. In such a large area emitter region 13, the base region 12 are exposed as islands arranged in a grid pattern. Further, contacts to connect a base electrode (not shown) and the base region 12 are effected at the exposed portions.

FIG. 20 shows a structure of a bipolar transistor of a stripe emitter type. In this structure, a plurality of long, narrow emitter regions 13 are arranged in almost parallel, being embedded in a base region 12 extended over the surface layer of a semiconductor substrate 1.

As described above, when, in these structures, an impurity concentration is low in a base region but high in a contact region of an electrode thereof, electrons, which are minority carriers, are blocked by a $P/P^+$ junction between the base region 12 and a $P^+$-type region 18 and in a switching operation, electrons are accumulated in the base region 12. This accumulation of electrons comes with a problem, since a switching loss becomes large, thereby not only preventing a high speed switching, (especially extending an off time,) but causing increase in power consumption.

Further, in transistors of a mesh emitter type shown in FIG. 18 and a ring emitter type shown in FIG. 19, safe operation areas of both types are comparatively narrow and withstand voltages are not necessarily sufficient. For the reasons, there arises a problem, since a sufficient current cannot be supplied to a load.

Furthermore, with a stripe emitter type of FIG. 20 being adopted, a withstand voltage is improved, but a case arises where a load driving ability is not sufficient. Among other points, a switching time of a transistor of this stripe emitter type is good compared with those of a mesh emitter type and a ring emitter type, but there arises a case where a further higher speed switching operation is required.

It is an object of the invention to provide a semiconductor device with a bipolar transistor enabling not only a high speed switching operation but reduction in power consumption.

It is another object of the invention to provide a semiconductor device with a bipolar transistor enabling a safe operation area to be wider.

It is still another object of the invention to provide a semiconductor device with a bipolar transistor enabling a reduction in voltage in an on state to be realized.

DISCLOSURE OF THE INVENTION

A semiconductor device with a bipolar transistor according to the invention comprises: a first conductivity type semiconductor layer serving as a collector region; a base region constituted of a second conductivity type region provided in the first conductivity type semiconductor layer; an emitter region constituted of a first conductivity region provided in the base region; and a base contact section provided oppositely from the emitter region in the base region, electrically connected to a base electrode, wherein the base contact section is constructed of a repeating structure in a plan view, in which a high impurity concentration region of the second conductivity type and a region of the first conductivity type are arranged in an alternate manner starting with the high impurity concentration region from a side of the emitter region.

For example, if the base region is a P-type region, the base contact section is constructed of a structure in which $P^+$-type region and $N^+$-type region are alternately arranged with the outermost side is of $P^+$-type. With such a structure, minority carriers in the base region, for example electrons in a case of a P-type base region, fall in $N^+$-type region, thereby enabling accumulation of minority carriers in the base region to be prevented from occurring. With prevention of the accumulation of minority carriers in the base region, a switching operation can not only be of a high speed, but reduce a switching loss, with the result that reduction in power consumption can be realized.

Another embodiment of a bipolar transistor according to the invention comprises: a first conductivity type semiconductor layer serving as a collector region; a base region constituted of a second conductivity type region provided in the first conductivity type semiconductor layer; an emitter region constituted of a first conductivity region provided in the base region; and a base contact section provided oppositely from the emitter region in the base region, electrically connected to a base electrode, wherein the base contact section is constructed of repeating structure in a plan view, in which a high impurity concentration region of the second conductivity type and a low impurity concentration region of the second conductivity type constituting the base region are arranged in an alternate manner starting with the high impurity concentration region from a side of the emitter region.

In this structure as well, since the low impurity concentration region contacts the base electrode to form Schottky junctions at the interfaces, minority carriers coming to the base electrode side due to an off state of operation are not accumulated in the base contact section but quickly released out through the Schottky junctions. As a result, similar to the above described structure, not only can an switching operation be of a high speed, but a switching loss decrease and reduction in power consumption can be achieved.

The emitter region comprises a plurality of stripes and the base contact section comprises a plurality of contact sections formed along each of the plurality of stripes in the base region between the plurality of stripes, or the base region comprises a plurality of regions exposed in a matrix pattern in the emitter region and the base contact section comprises a plurality of contact sections formed at each of a plurality of regions of the base region exposed in the matrix (island) pattern, thereby enabling realization of a bipolar transistor capable of a large current operation.

If an emitter electrode connected to the emitter region and a base electrode connected to the base contact section are formed in respective comb structures in which teeth of the emitter electrode and the base electrode are engaged with each other being alternately arranged, the base and emitter electrodes can be connected to the base region and the emitter region, respectively, located in the vicinity thereof at a low level of resistance loss.

The emitter region comprises a plurality of stripe regions and the stripe regions are formed so as to expose the base region at respective central portions of the stripe regions and an emitter electrode is formed, being connected to the emitter regions, so as to cover the exposed portions of the base region, and thereby, since no electrode is formed in the exposed portions of the base region at the central portion of the stripe regions, there arises no necessity of a space to form base electrode, which enables to increase a contact area between the emitter region and the base region to about twice, and the safe operation area is sufficiently enlarged. With this structure being adopted together with the base contact section, the switching speed can be high, and the safety operation area can also enlarged sufficiently, but furthermore, a safety operation area can be wider with this structure adopted, independently of a structure of the base contact section.

The base region exposed at the central portion of each of the stripe regions may be segmented into a plurality along a direction of the stripe, or the base region exposed at the central portion of each of the stripe regions may be provided such that each of the stripe regions is segmented along a direction of the stripe and the emitter electrode may be formed over the two segmented stripe regions and the base region exposed therebetween.

BRIEF DESCRIPTION OF THE DRAWINGS

FIG. 6 is an enlarged, plan view showing a structure of a base contact section of FIG. 5;

BEST MODE FOR CARRYING OUT THE INVENTION

Figure 1:
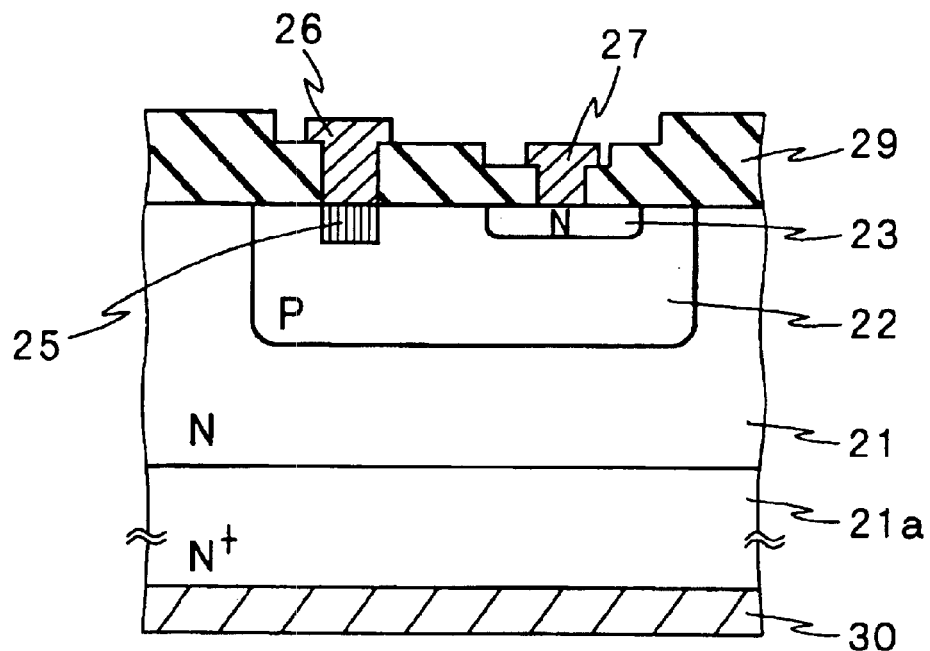
FIG. 1 is a sectional view showing a fundamental structure of a bipolar transistor relating to an embodiment of a semiconductor device according to the present invention.

FIG. 1 is a sectional view showing a fundamental structure of a bipolar transistor relating to an embodiment of the invention. A P-type base region 22 is formed at the surface of an N-type semiconductor layer 21 and an N-type emitter region 23 is formed in the P-type base region 22. With such regions in place, an NPN structure is formed and the N-type semiconductor layer 21 and an $N^+$-type semiconductor substrate 21a constitute a collector region. At the surface of the base region 22, a base contact section in which a $P^+$-type region and an $N^+$-type region are alternately formed (such a base contact section hereinafter will be referred to as a universal contact section 25) is provided at a position spaced from the emitter region 23 and a base electrode 26 is in contact with the universal contact section 25. Further, an emitter electrode 26 is in contact with the emitter region 23. A collector electrode 30 is formed at the back surface side of the semiconductor substrate 21a. A numerical mark 29 indicates an insulation film.

Figure 2:
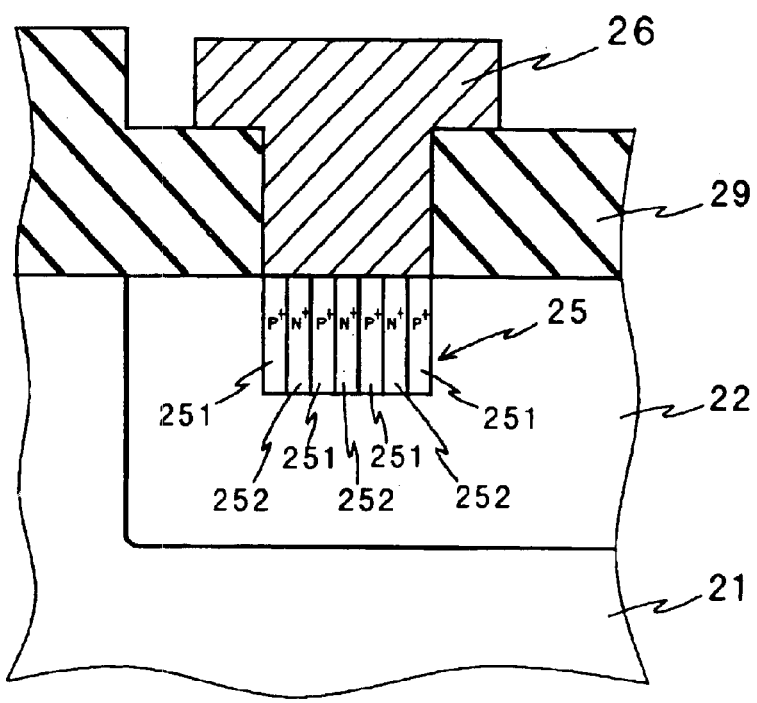
FIG. 2 is an enlarged, sectional view showing a structure in the vicinity of a base contact section of FIG. 1.

FIG. 2 is an enlarged, sectional view showing a structure in the vicinity of the universal contact section 25. In the example shown in FIG. 2, the universal contact section 25 is constructed of a plurality of P⁺-type regions 251 of a small width and a plurality of N⁺-type regions 252 of a small width arranged alternately while being in contact with the base electrode 26. That is, the P-type region 251 and the N-type region 252 are alternately arranged along a cross direction to a direction in which the electrical charges move between the base region 22 and the base electrode 26.

With such a structure, holes in the base region 22, which are majority carriers, can move through the P⁺-type region 251 while electrons, which are minority carriers, can fall in the N⁺-type region 252. Therefore, accumulation of electrons in the base region 22 is suppressed, thereby enabling a switching with a high speed and less of a loss.

Figure 3:
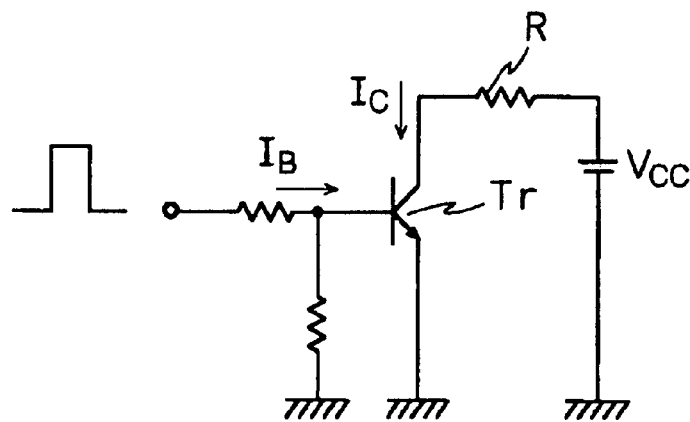
FIG. 3 is an electrical circuit diagram showing a configuration of a switching circuit using a bipolar transistor.
Figure 4:
FIGS. 4(a) to 4(c) are graphs of waveforms for description of operating characteristics of a bipolar transistor.
Figure 4:
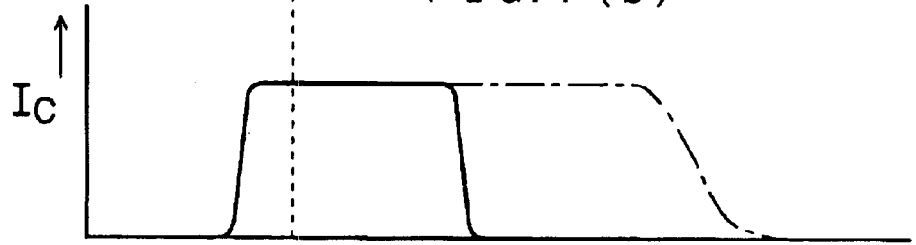
Figure 4:
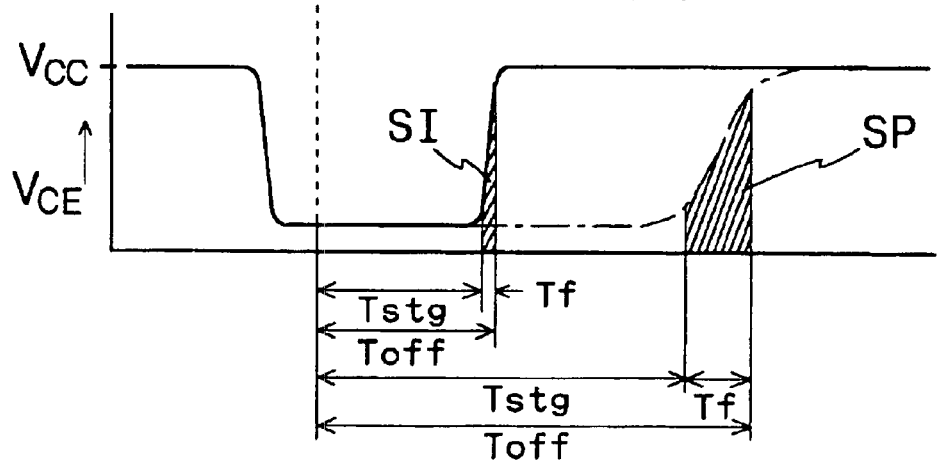

FIG. 3 is a electrical circuit diagram showing a configuration of a switching circuit using a bipolar transistor (Tr) and FIGS. 4(a) to 4(c) are graphs showing switching characteristics of a bipolar transistor (Tr), wherein FIG. 4(a) shows a base current $I_B$, FIG. 4(b) shows a collector current $I_C$ and FIG. 4(c) shows a collector-emitter voltage $V_{CE}$. In FIGS. 4(b) and 4(c), characteristics when the bipolar transistor of FIG. 1 is applied to the transistor (Tr) are shown with a solid line while characteristics when a conventional bipolar transistor shown in 16 is applied to the transistor (Tr) are shown with a double dot & dash line.

As is clear from FIGS. 4(a) to 4(c), it is understood that a turn off time $T_{off}$ (=$T_{stg}$+$T_f$) which is a sum of a storage time ($T_{stg}$) and a decay time ($T_f$) when the transistor (Tr) is turned off is conspicuously improved if a bipolar transistor having a universal contact of this embodiment is employed.

The time $T_{off}$ required to reduce accumulation of carriers in the base region 22 to nothing can be shorter to about one half to about one-thirds of in a case of a conventional structure by adopting the structure of this embodiment. A power loss of the transistor (Tr) in an off state can be expressed with areas of respective regions SI (in the case of the structure of this embodiment) and SP (in the case of the conventional structure) in FIG. 4(c) and to be more concrete, the loss can be expressed by the following formula (1):

$$\frac{1}{2} Ic \cdot V_{CE}(sat) \cdot (Tstg/T) + \frac{1}{6} Ic \cdot Vcc \cdot Tf \qquad (1)$$

where T represents a cycle time.

Therefore, when a bipolar transistor of this embodiment which can shorten the time $T_{off}$ by a great margin is employed, power consumption can be also reduced tremendously. In addition, with this structure applied, it was confirmed that the safe operation area can be improved to the same level as that of the stripe emitter type.

Figure 5:
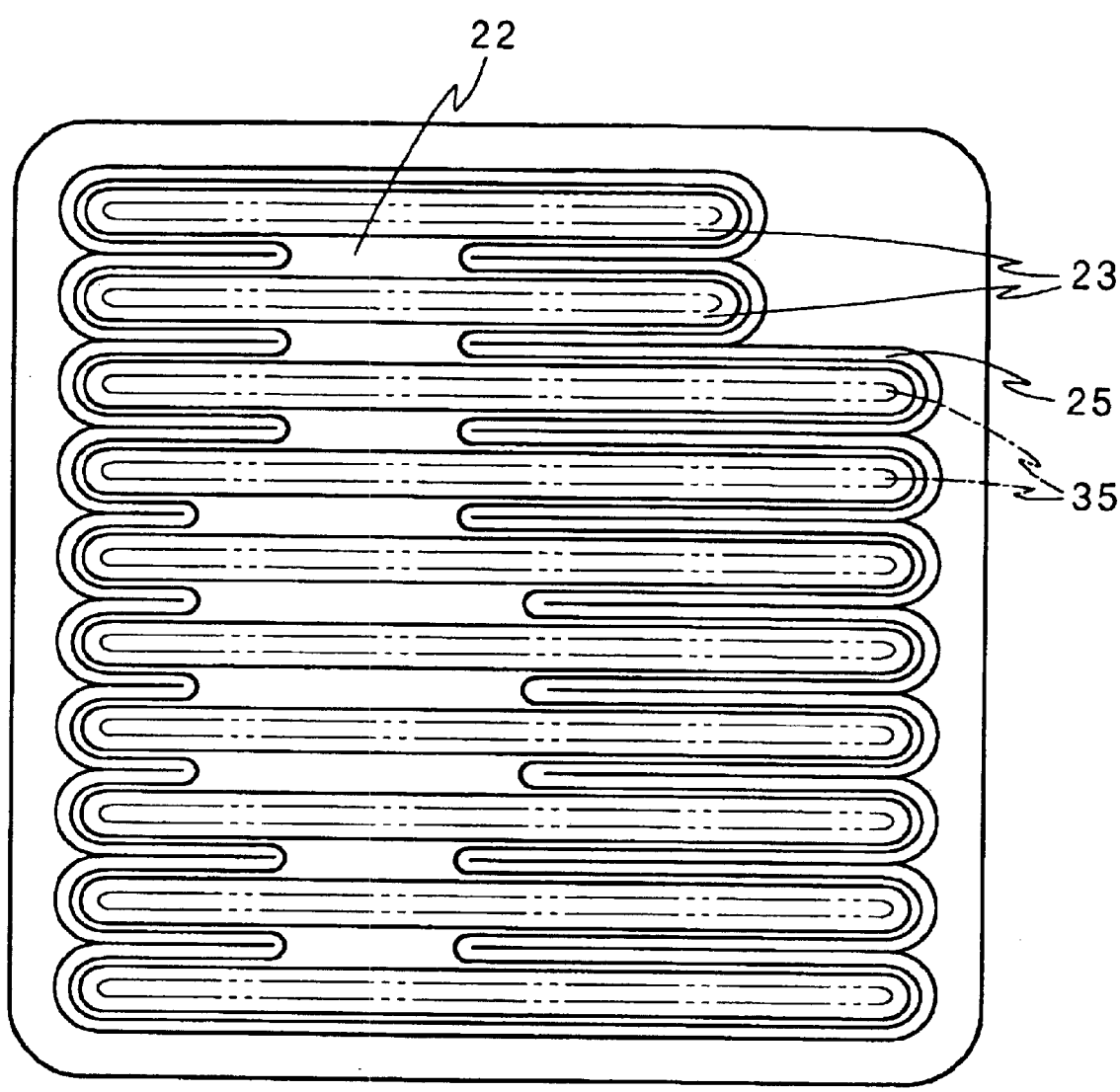
FIG. 5 is a plan view showing a concrete structure of a bipolar transistor according to the present invention.

FIG. 5 is a plan view showing a concrete structure of a bipolar transistor of a stripe emitter type relating to this embodiment. In the base region 22, there are formed emitter (stripe) regions 23 of a pattern constituted of a plurality of strips repeating in a direction, leftward and rightward, on FIG. 5. A universal contact section 25 is formed in a belt form such that the universal contact section winds around each of edges of the emitter regions 23 and penetrate into between adjacent emitter (stripe) regions 23.

As shown in FIG. 6 in an enlarged manner, the belt-like universal contact section 25 is formed along its length direction, and includes belt-like P⁺-type regions 251 and N⁺-type belt-like regions 252 arranged alternately in its width direction.

Figure 7:
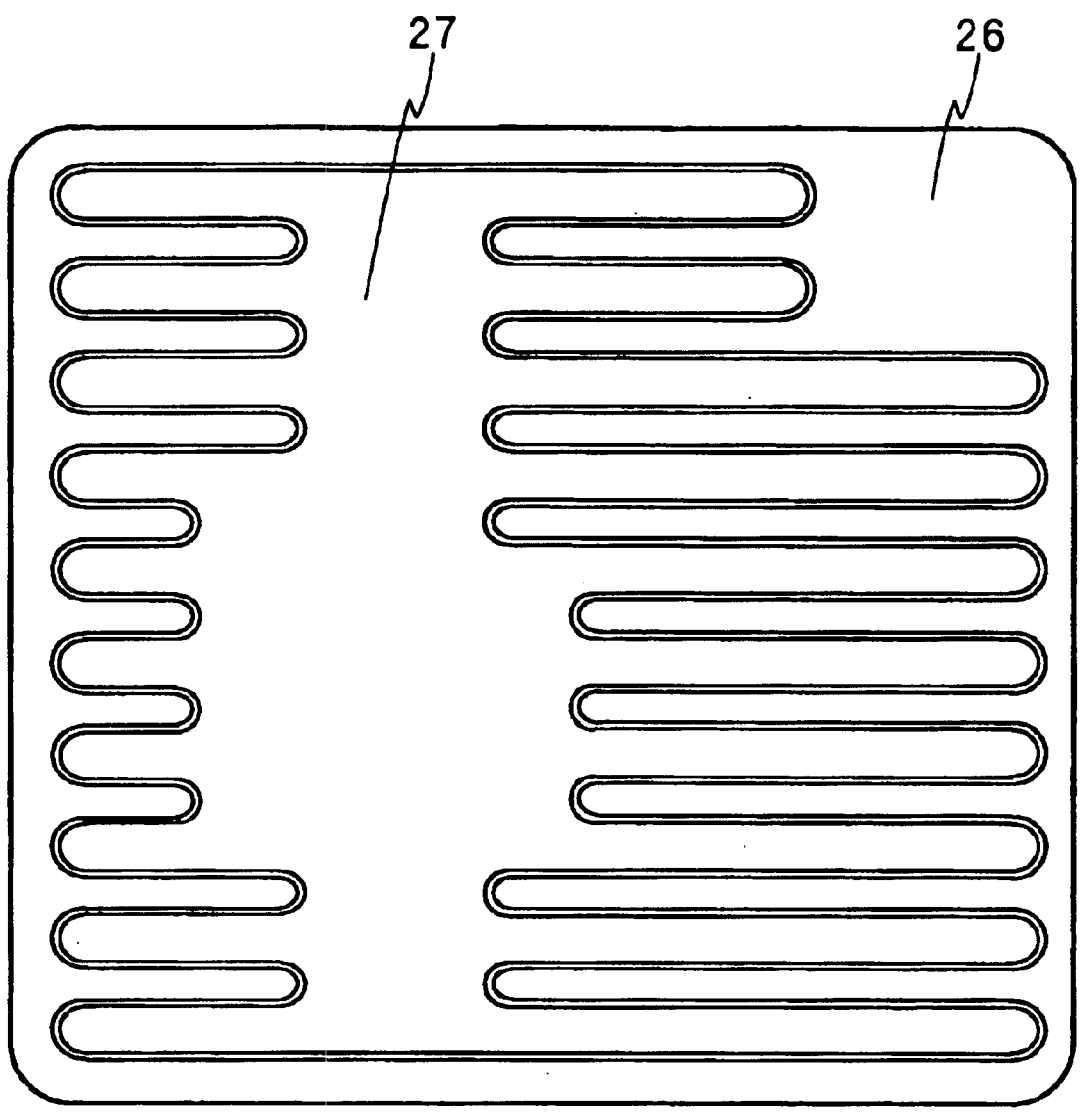
FIG. 7 is a plan view showing electrodes arrangement of the example shown in FIG. 5.

An insulation film (not shown) is formed so as to cover the emitter regions 23 and a universal contact section 25 and, in the insulation film, a plurality of contact holes 35 are formed through which contact holes the emitter regions 23 are exposed and a plurality of contact holes (not shown) are formed through which contact holes the universal contact section 25 is exposed. As shown in FIG. 7, the emitter electrode 27 is formed so as to be commonly connected to the plurality of contact holes 35 and the base electrode 26 is formed so as to be connected to the plurality of contact holes through which the universal contact section 25 is exposed. The base electrode 26 and the emitter electrode 27 may be formed in patterns of combs, as shown in FIG. 7, which teeth are engaged with each other in a alternate manner.

Figure 8:
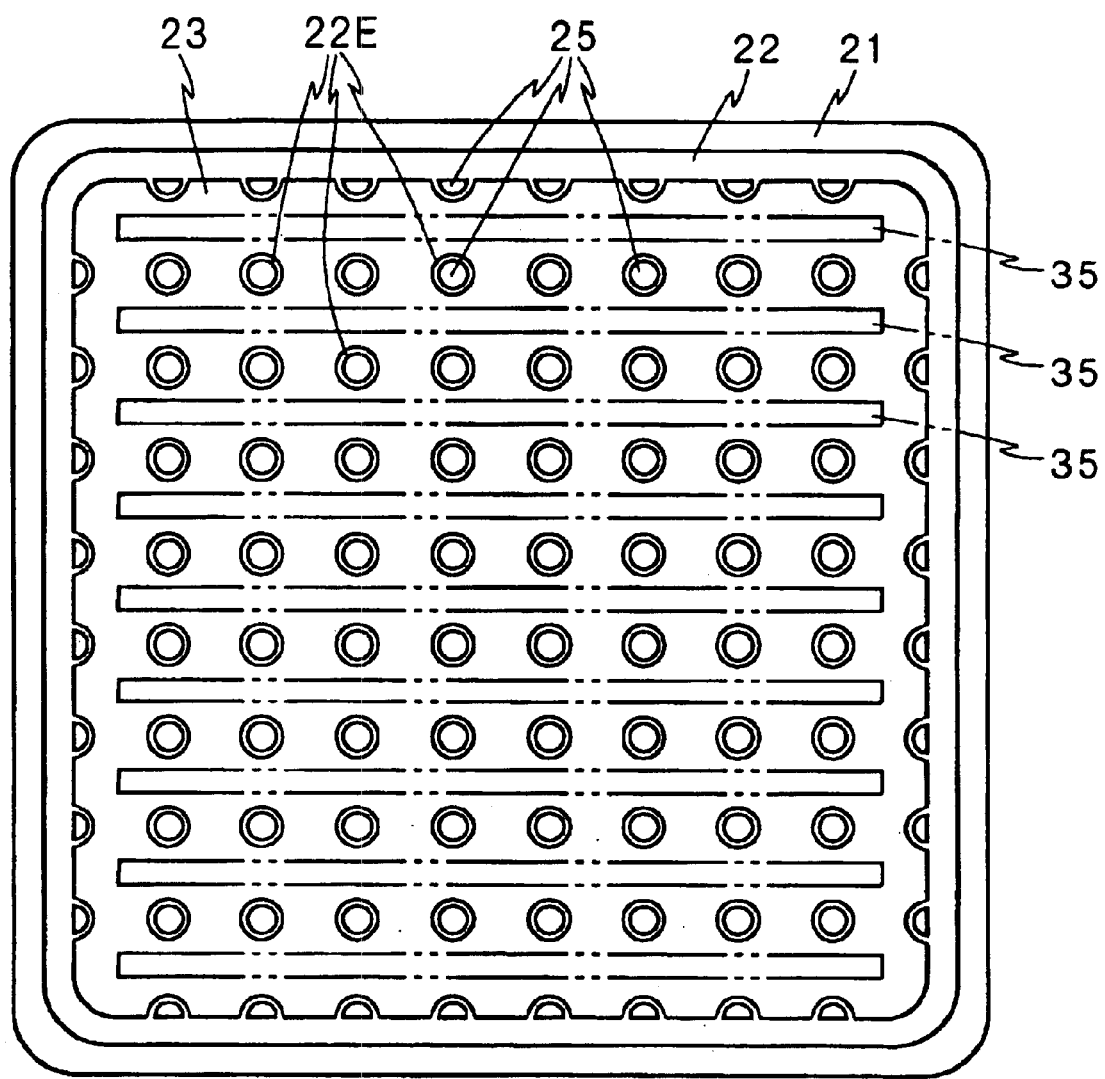
FIG. 8 is a plan view showing another concrete structure of a bipolar transistor.

FIG. 8 is a plan view showing another concrete structure of a bipolar transistor relating to the above described embodiment. This example is of a multi-base structure and exposed sections 22E of the base region 22 are arranged in a matrix pattern of dots and in other regions than the base region 22, the emitter region 23 is exposed at a surface of the semiconductor substrate. The universal contact sections 25 are formed in the exposed sections 22E.

Figure 9:
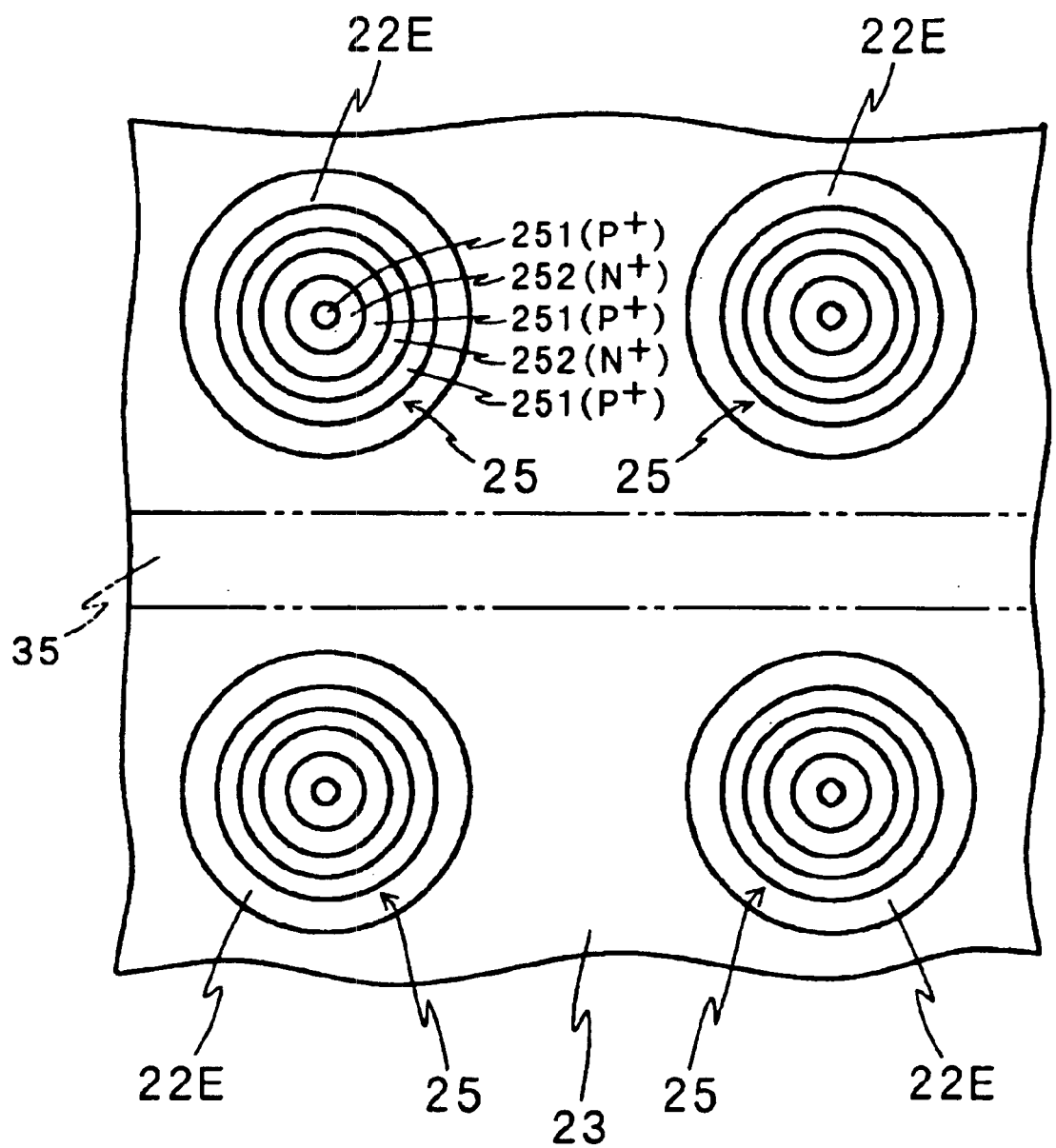
FIG. 9 is an enlarged, plan view showing a structure of a base contact section of FIG. 8.

That is, as shown in FIG. 9 in enlarged manner, the P⁺-type regions 251 and the N⁺-type regions 252 formed in concentric circles are alternately arranged in a radial direction to form a universal contact section 25.

Figure 10:
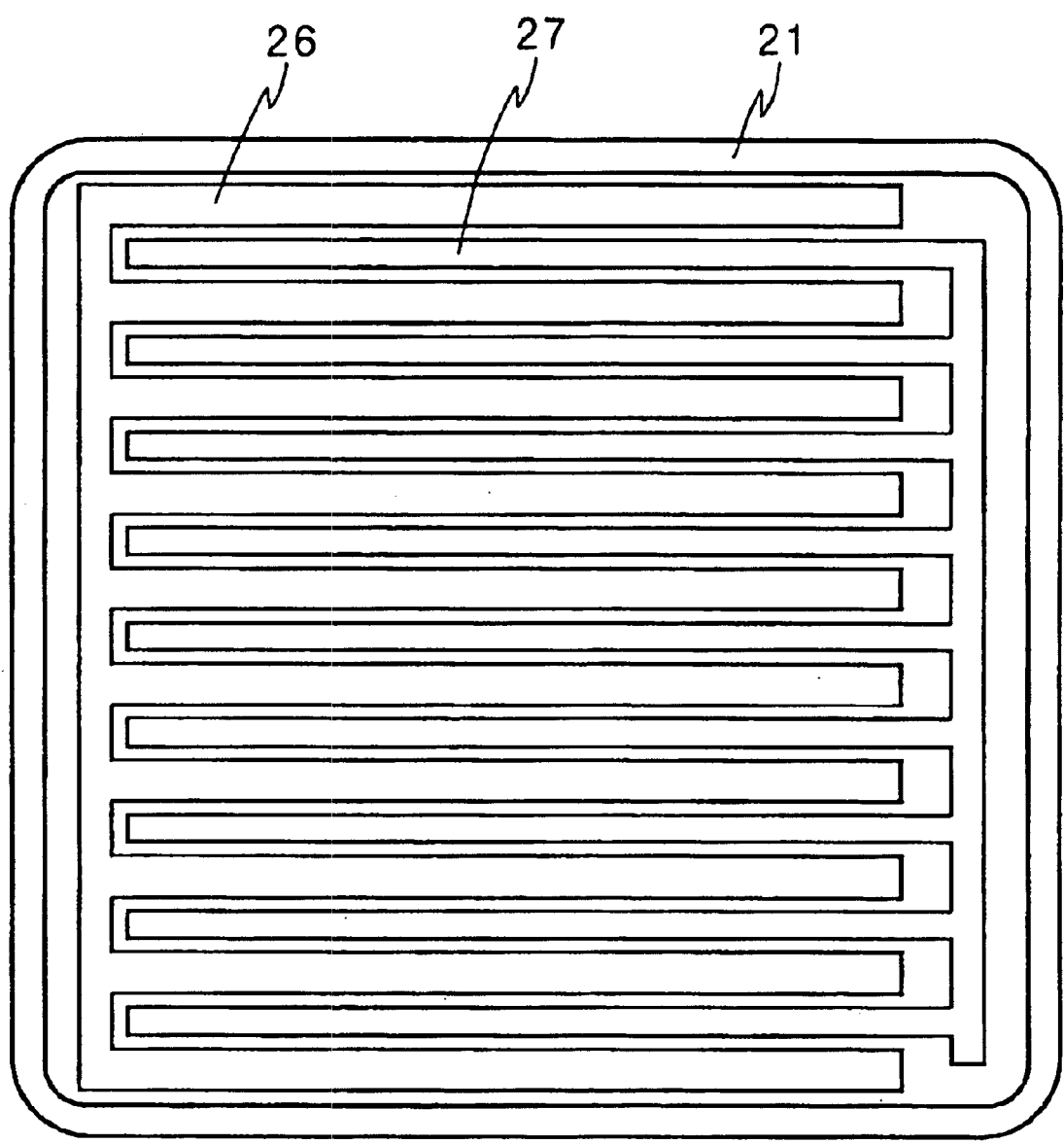
FIG. 10 is a plan view showing electrodes arrangement of the example shown in FIG. 8.

In this structure as well, as shown in FIG. 10, the base electrode 26 and the emitter electrode 27 can be in a pattern of combs whose teeth are engaged with each other in a alternate manner. The base electrode 26 is in contact with the universal contact sections 25 through contact holes (not shown) and the emitter electrode 27 is in contact with the emitter region 23 through contact holes 35 (see FIG. 8) formed in place.

Figure 11:
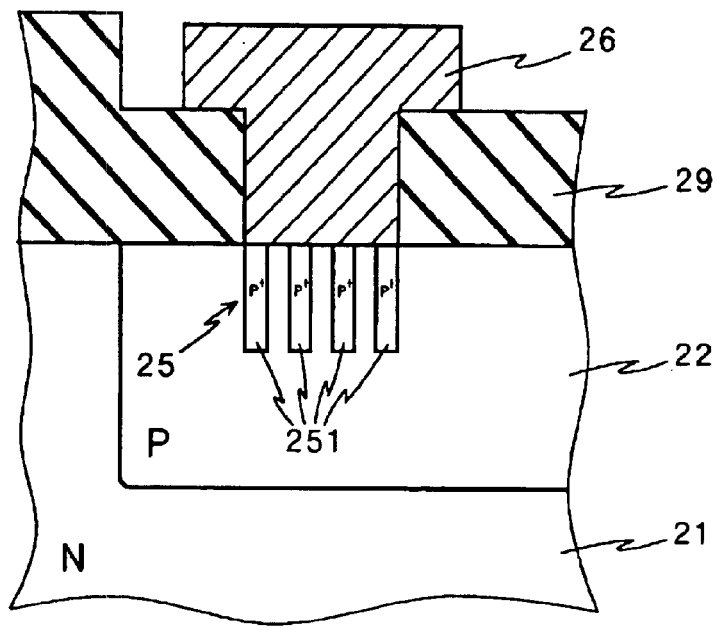
FIG. 11 is a sectional view showing another embodiment of a base contact section of a semiconductor device according to the present invention.

FIG. 11 is an enlarged, sectional view showing a universal contact section of a bipolar transistor relating to another embodiment of the present invention. In FIG. 11, constituents corresponding to those in FIG. 2 are indicated by the same marks as those used in the case of FIG. 2. In this embodiment, a universal contact section 25 is formed so as to be included in a P-type base region 22 and constituted of a plurality of P⁺-type regions 251 arranged in a manner such that any adjacent two are spaced from each other along a cross direction to a direction in which the electrical charges move. In a space between adjacent P⁺-type regions 251, a Schottky junction is formed between the base electrode 26 and the P-type base region 22 and further, the P⁺-type regions 251 and the Schottky junctions are alternately arranged to form the Schottky universal contact.

In this structure, minority carriers accumulated in the base region 22 can be quickly released out through the Schottky junctions. With the release of minority carriers, similar to the above described first embodiment, accumulation of minority carriers in the base region 22 can be suppressed, thereby enabling not only a high speed switching operation but low power consumption driving.

While the two embodiments of the present invention have been described, the invention can be also carried out in other embodiments. For example, in the above described embodiments, an NPN transistor has been taken as an example, the present invention can be applied to a PNP transistor as well. In the case of PNP transistor, there is only require to be provided a universal contact section of a configuration in which N⁺-type regions and P⁺-regions are alternately arranged in an N-type base region or a universal contact section with Schottky junctions of a configuration in which a plurality of N⁺-type regions are arranged in a spaced manner. Furthermore, electrode materials such as titanium (Ti), in addition to aluminum (Al), can be used in the Schottky junction sections.

In addition, while in the above described embodiments, a semiconductor device with a single bipolar transistor has been taken up, the present invention can be applied to a semiconductor device with a plurality of bipolar transistors and a semiconductor device with functional elements other than a bipolar transistor together with the bipolar transistor on the same semiconductor substrate.

Figure 12:
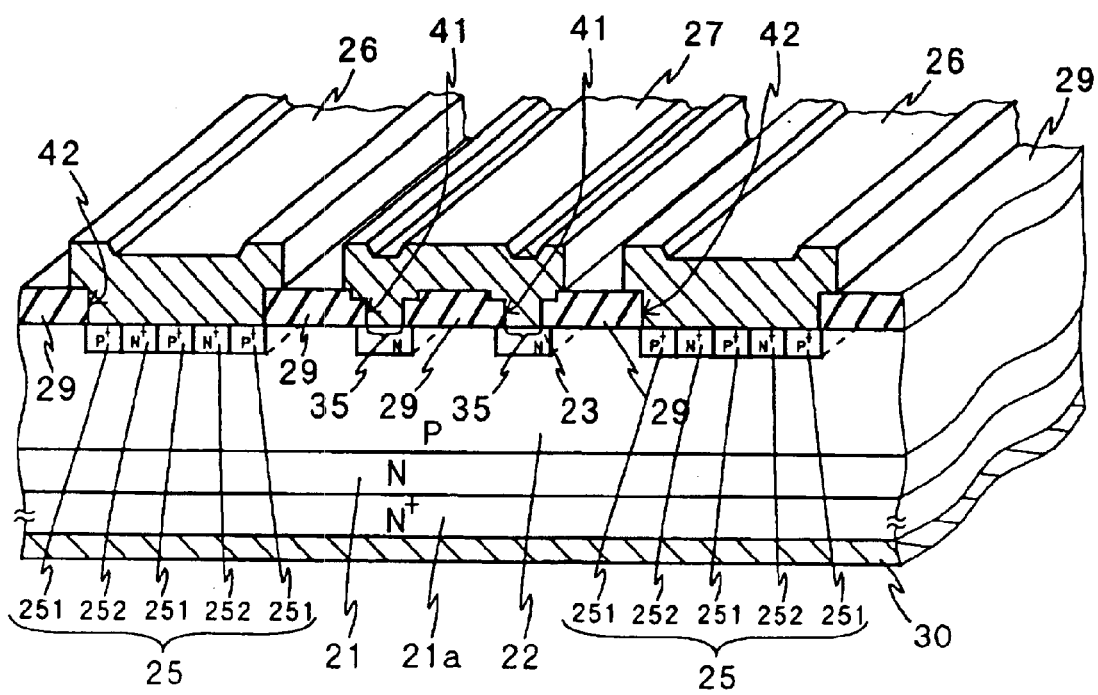
FIG. 12 is a perspective view showing still another embodiment of a semiconductor device according to the present invention.

FIG. 12 is an enlarged, perspective view together with a sectional view showing a structure of part of a transistor of an example in which a safe operation area is further widened. A P-type base region 22 is formed at a surface of an N-type semiconductor layer 21 and N-type emitter regions 23 are formed on the surface side of the P-type base region 22 in the stripe form. With this structure, an NPN structure is formed and an N-type semiconductor layer 21 and a semiconductor substrate 21a constitute a collector region 21.

Figure 13:
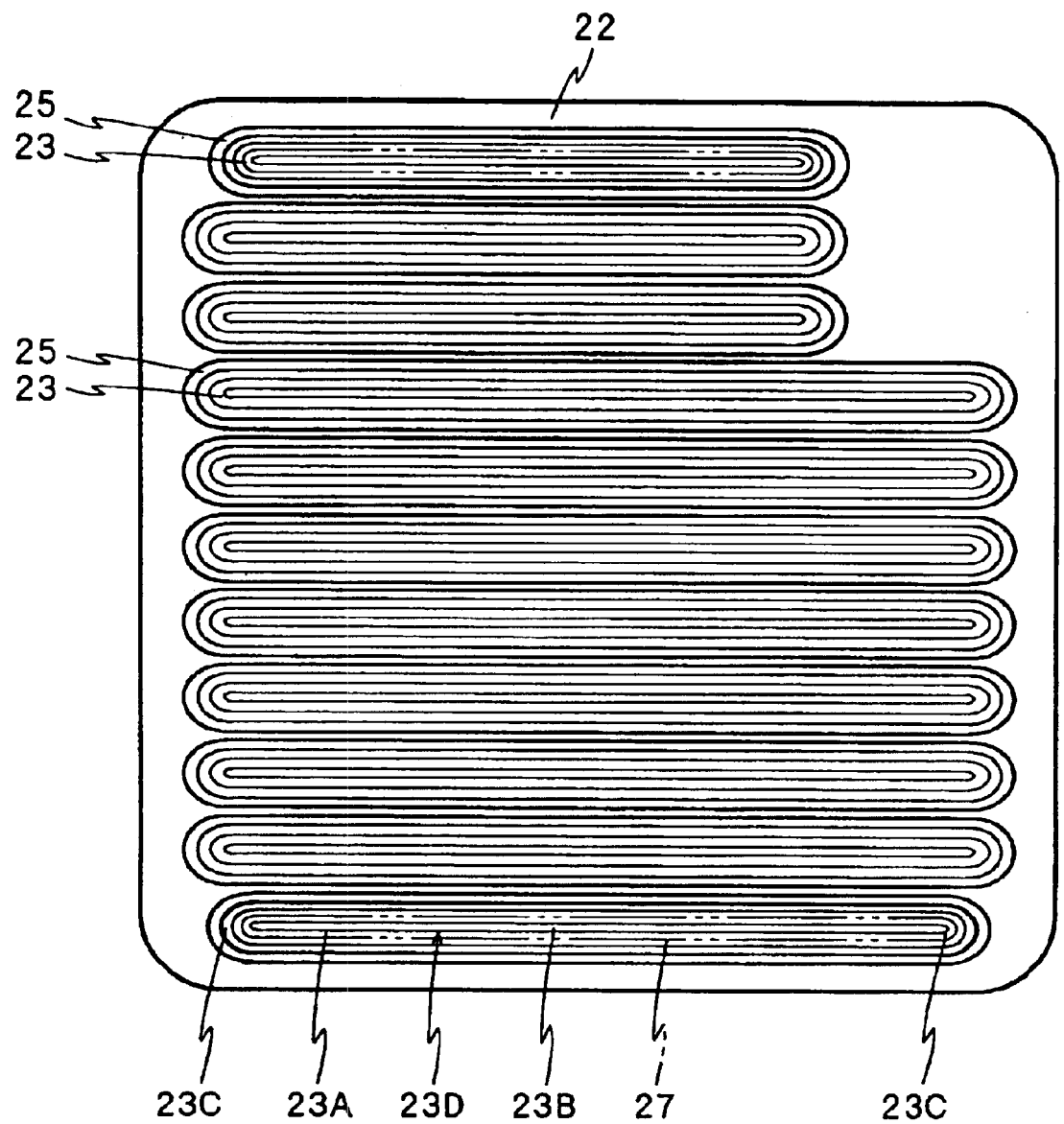
FIG. 13 is a view showing a plane arrangement of FIG. 12.

As shown in a plan view of FIG. 13, the emitter regions 23 are each formed in a closed ring pattern extending linearly in one direction. The emitter regions 23 of a linear ring pattern are formed in plural number while being exposed in a stripe pattern on a semiconductor layer 21. Base contact sections 25 of a linear ring pattern are provided so as to enclose the respective emitter regions 23 of a linear ring pattern at a constant distance between an emitter region 23 and the innermost base contact section 25.

Figure 14:
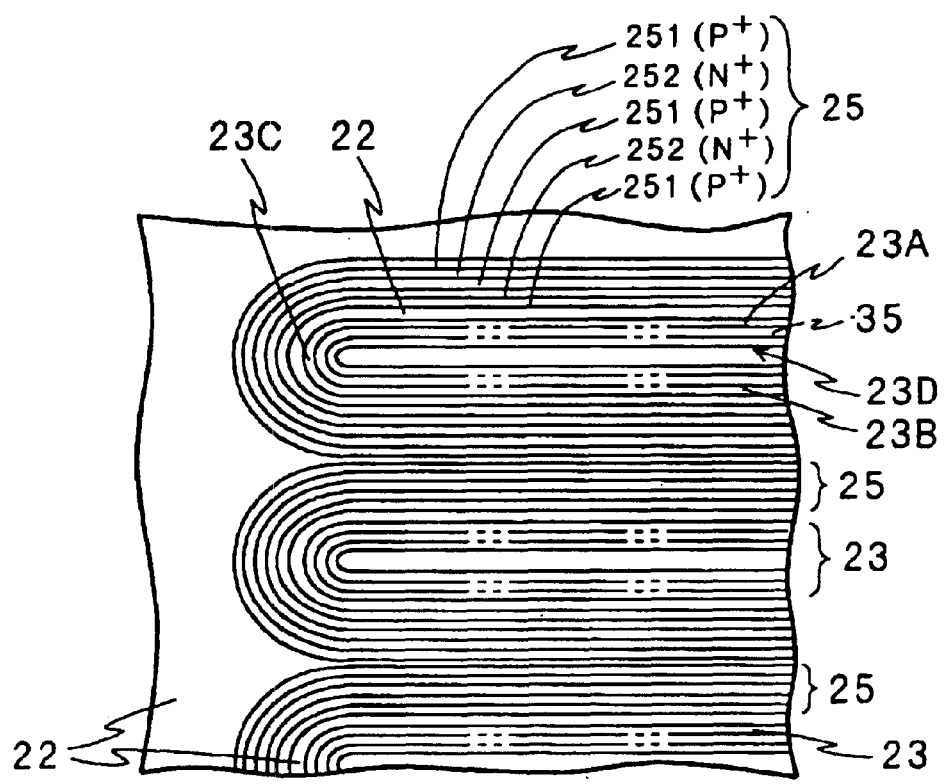
FIG. 14 is an enlarged, plan view showing a structure of a base contact section of FIG. 13.

As shown in FIG. 14 in an enlarged manner, the emitter regions 23 are arranged over almost the entire width of the base region 22, and each comprise a pair of straight portions 23A and 23B parallel to each other and connection sections 23C of a semicircular shape, connecting between both ends of one side or the other side of the straight portions 23A and 23B of a pair with an opening 23D inside of the emitter region 23 in which the base region 25 comes.

As shown in FIG. 12, a base electrode 26 is in contact with base contact sections 25. Further, a contact region 35 of a linear ring pattern with a narrower width than that of the emitter region 23 is provided at the surface of the emitter region 23 of a linear ring pattern and at the contact region 35, an emitter electrode 27 is in contact with the emitter region 23. A collector electrode 30 is provided at the rear (back) surface side of the semiconductor substrate 21a. A numerical mark 29 is an insulation film.

A base contact section 25 has a universal contact in which $P^+$-type regions 251 with a small width and $N^+$-type regions 252 with a small width are alternately arranged while being in contact with a base electrode 26. That is, the $P^+$-type regions 251 and the $N^+$-type regions 252 are alternately arranged along a cross direction to a direction in which electrical charges move between the base region 22 and the base electrode 26. In a plan view, as shown in FIG. 14 in an enlarged manner, the $P^+$-type regions 251 and the $N^+$-type regions 252 are of a belt pattern extending along a length direction of the base contact section 25 of a ring belt pattern.

With this structure, as described above, holes, which are majority carriers, in the base region 22 can pass through the $P^+$-type regions 251 while electrons, which are minority carriers, in the base region 22, can fall into the $N^+$-type regions 252. Therefore, accumulation in the base region 22 is suppressed, thereby enabling switching with a high speed and less of a loss.

A plurality of contact holes 41 (see FIG. 12) through which the contact regions 35 of a ring pattern are exposed and a plurality of contact holes 42 through which the base contact sections 25 are exposed are formed in an insulation film 29 formed so as to cover the emitter regions 23 and the base contact sections 25. Similar to FIG. 7, which is described above, the emitter electrode 27 is formed so as to be commonly communicated with the contact holes 41 for a plurality of emitter regions 23 while the base electrode 26 is formed so as to be commonly communicated with the contact holes 42 through which a plurality of base contact sections 25 are exposed. The base electrode 26 and the emitter electrode 27 may be formed in comb patterns whose teeth are engaged with each other as shown in FIG. 7.

Figure 15:
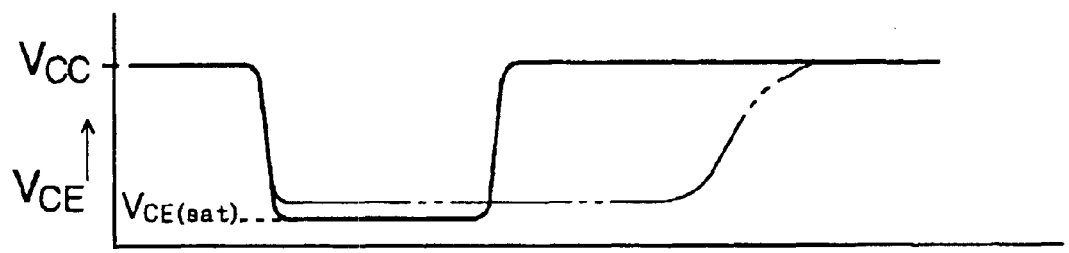
FIG. 15 is a graph showing switching characteristics of the example of FIG. 12.

When the switching circuit as shown in FIG. 3 is configured using this transistor, a collector-emitter voltage VCE characteristic similar to FIG. 4(c) is shown in FIG. 15, so that similar effects of the above described are attained on switching time and power loss in an off state and furthermore a sufficient current can be made to flow to a load, and thereby, it is understood that a safe operation area is wider and a withstand voltage can be increased.

Therefore, when a bipolar transistor of this embodiment in which a time $T_{off}$ can be exceptionally shortened is employed, power consumption can be reduced to a great degree Besides, in the structure of this embodiment adopting an emitter region 23 of a linear ring pattern, a collector-emitter voltage $V_{CE}$ (sat) in an on state can be reduced to 50% of that of a conventional structure, whereby a power loss can be reduced as well.

In the structure of this embodiment, the emitter regions are arranged as stripes in parallel each of a linear ring pattern. Therefore, as is apparent from comparison between FIGS. 12 and 20, an area of emitter-base junctions is about twice as large as that in a conventional structure. That is, the emitter regions 23 of this embodiment can have a perimetric length of about twice that of a conventional structure in the neighborhood of the surface of semiconductor substrate where a current is apt to concentrate because of a skin effect. With this increase in the perimetric length, a low current density at the base-emitter junction interface is realized when a current is made to flow, thereby enabling to suppress rise in temperature at the junction interface. With this suppression of temperature rise, a large current can be passed, which makes it possible to achieve a good withstand voltage and ensure a wider safe operation area.

Figure 20:
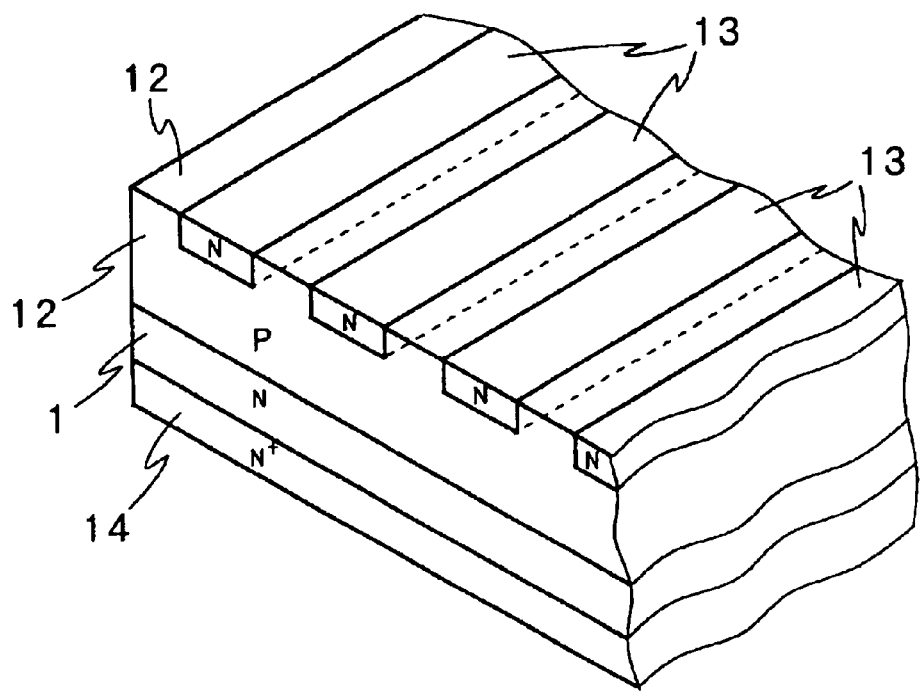
FIG. 20 is a simplified perspective view for description of a bipolar transistor of a stripe emitter structure.

Although this structure is likely to be similar to a stripe emitter structure with a narrower emitter width than that as shown in FIG. 20 for example, it is different from the stripe emitter structure in that a contact area between emitter regions and a base region can be increased in a narrow chip area, since in the case of FIG. 20, base electrodes are formed in contact with all base regions between the emitter regions and thereby, widths of the emitter electrodes and the base electrodes cannot be equal to or less than certain widths which are less than the maximums, while in this embodiment, no contact is formed in base regions provided within ring emitter regions and in addition to this, an emitter electrode is formed between emitter regions extending across a base region interposed therebetween.

From this viewpoint, it is concluded that when a structure is adopted in which an emitter electrode is formed between adjacent two emitter regions of a stripe pattern in a straddling manner, that is, a base region with no contact is formed in a central portion of a conventional stripe emitter, even if the emitter regions are not of a linear ring pattern as in the above described example. With this structure as well, a contact area between the base region and the emitter region is doubled, thereby enabling a safe operation area to be increased to a great extent. To be concrete, it has been confirmed that in any of cases of a resistance load and an inductive load, a withstand voltage of about twice as large as that of a conventional structure can be realized.

In this example, an NPN transistor is taken for description, but the present invention can be applied to a PNP transistor as well. In the case of a PNP transistor, the following universal contact structures are only required to be formed in the base electrode contact section: a universal contact structure in which $N^+$-type regions and $P^+$-type regions are alternately arranged in an N-type base region, or a Schottky universal contact structure in which a plurality of $N^+$-type regions are arranged in a spaced manner. Further, the Schottky sections may be formed with titanium (Ti), in addition to aluminum (Al).

It is recommended that as a semiconductor substrate 21, a substrate of a resistivity as low as of the order of 7 Ω·cm (corresponding to an impurity concentration of the order of about $1 \times 10^{21}$ atoms/cm$^3$) doped with an impurity (for example, arsenic in a case of an N-type and boron in a case of a P-type) may be employed and thereby, a collector-emitter voltage $V_{CE}$ is further reduced.

In addition, while in the above described embodiment, description is made of an example in which emitter regions of a linear ring pattern and a universal contact structure are combined, the universal contact structure may be omitted when only reduction in a collector-emitter voltage VCE and improvement on a withstand voltage are important tasks but improvement on a switching time is not so much concerned.

Figure 16:
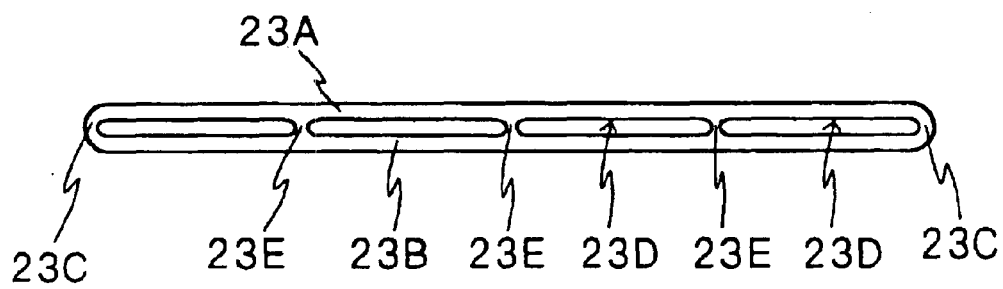
FIG. 16 is a plan view showing a modification of the embodiment of FIG. 12.
Figure 17:
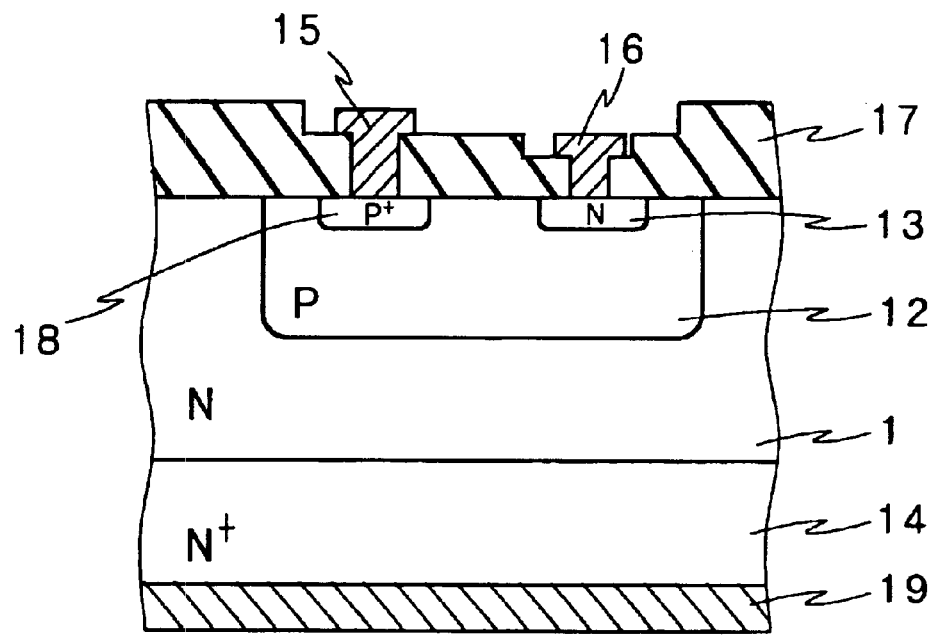
FIG. 17 is a sectional view showing a fundamental structure of a conventional bipolar transistor.
Figure 18:
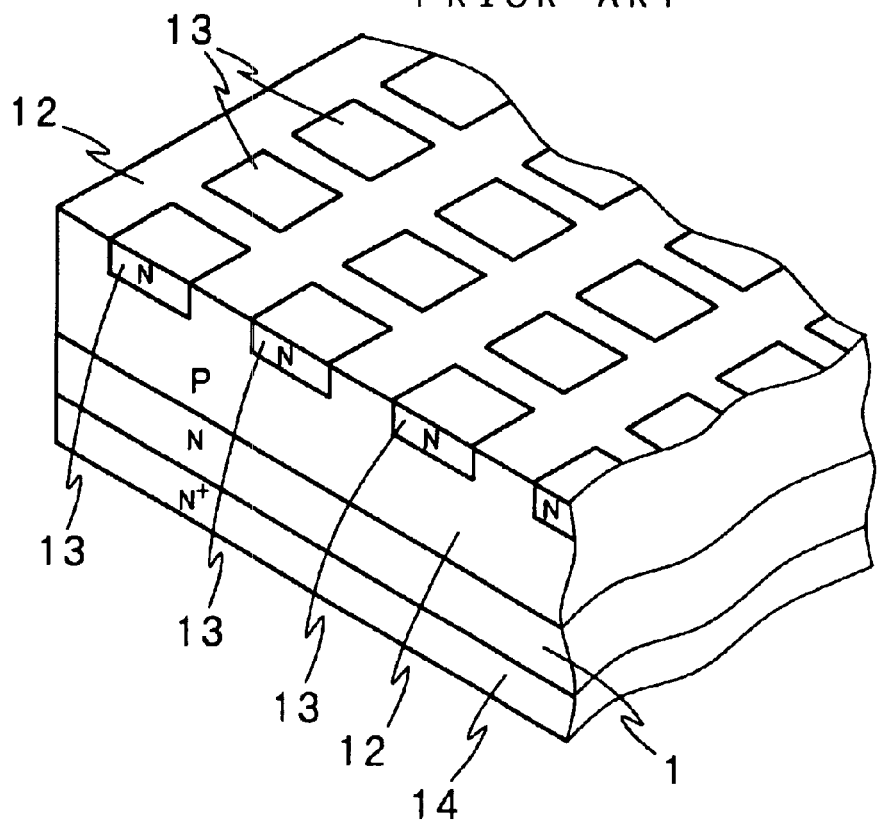
FIG. 18 is a simplified, perspective view for description of a bipolar transistor of a mesh emitter (multi-emitter) structure.
Figure 19:
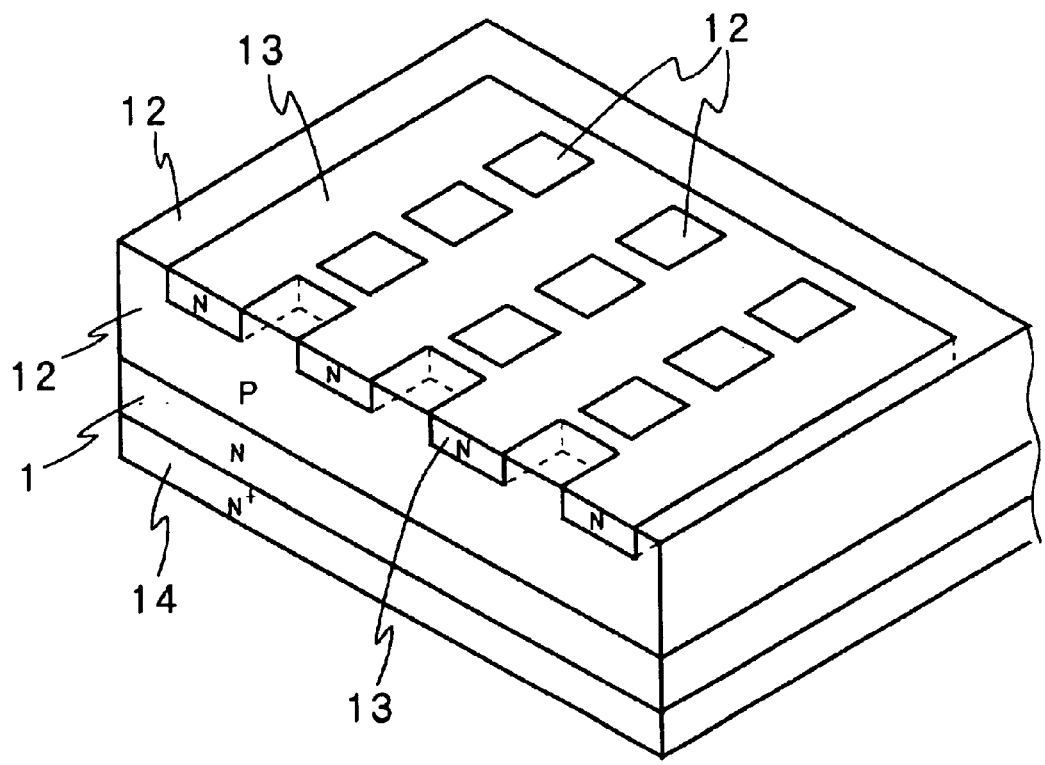
FIG. 19 is a simplified, perspective view for description of a bipolar transistor of a ring emitter (multi-base) structure.

Further, while in the above embodiment, an linear emitter region 23 is of a simple ring structure with one opening 23D, a modification of the linear ring structure may be adopted, as shown in FIG. 16, in which bridge sections 23E bridging the straight sections 23A and 23B are provided and the opening 23D is divided into plural openings.

Furthermore, while in the above embodiment, a semiconductor device having one bipolar transistor is taken as an example, the invention can be applied to a semiconductor device with a plurality of bipolar transistors and a semiconductor device with functional devices other than a bipolar transistor together with a bipolar transistor on the same semiconductor substrate.

INDUSTRIAL APPLICABILITY

According to the present invention a semiconductor device with a bipolar transistor is obtained, which has the high speed switching operation and the improved withstand voltage. As a result, it is utilized in switching power supplies, DC-DC converters in the consumer electric equipment such as televisions, computers, telephones and the like, and so on.

What is claimed is:

1. A semiconductor device with a bipolar transistor comprising:

a first conductivity type semiconductor layer serving as a collector region;

a base region constituted of a second conductivity type region provided in said first conductivity type semiconductor layer;

an emitter region constituted of a first conductivity type region provided in said base region; and a base contact section spaced apart from said emitter region in said base region, electrically connected to a base electrode, wherein said emitter region comprises a plurality of stripe regions and each of said stripe regions is formed so that a plurality of portions of said base region are exposed at the central portion of each of said stripe regions, each of said plurality of portions of said base region is surrounded by a corresponding one of said plurality of stripe regions of said emitter region, and an emitter electrode is formed so as to be connected to said plurality of stripe regions and to cover the exposed portions of said base region via an insulating film, wherein said base contact section is constructed of a repeating structure in a plan view, in which a high impurity concentration region of the second conductivity type and a region of the first conductivity type are arranged in an alternate manner.

2. The semiconductor device of claim 1, wherein said emitter electrode connected to said emitter region and said base electrode connected to said base contact section are formed in respective comb structures in which teeth of said emitter electrode and said base electrode are engaged with each other in an alternate manner.

\* \* \* \* \*